United States Patent [19]

Hemmi et al.

[11] Patent Number: 4,625,534
[45] Date of Patent: Dec. 2, 1986

[54] CRIMP CUTTER BLADE

[75] Inventors: Saburo Hemmi, Narashino; Isao Sato, Ohmiya, both of Japan

[73] Assignee: 501 Sinano Electric Co., Ltd., Tokyo, Japan

[21] Appl. No.: 663,988

[22] Filed: Oct. 23, 1984

[30] Foreign Application Priority Data

Oct. 25, 1983 [JP] Japan .................................. 58-199558

[51] Int. Cl.⁴ ............................................ B21D 28/00
[52] U.S. Cl. ........................................ 72/326; 72/409;
7/107; 29/838; 29/566.3
[58] Field of Search ................ 72/326, 330, 331, 409,
72/410; 140/105, 106; 7/107; 81/462, 418;
29/838, 844, 845, 566.3, 566.4, 761

[56] References Cited

U.S. PATENT DOCUMENTS

| 777,412 | 12/1904 | Hamel et al. | 7/107 |
| 2,783,483 | 3/1957 | Seher | 7/107 |
| 2,915,755 | 12/1959 | Kinkaid | 72/330 |
| 3,003,376 | 10/1961 | Macy et al. | 72/410 |
| 3,178,926 | 4/1965 | Logan | 72/410 |
| 3,348,405 | 10/1967 | Johnson | 72/409 |

FOREIGN PATENT DOCUMENTS 874280  4/1953  Fed. Rep. of Germany ........ 72/409

Primary Examiner—Daniel C. Crane
Attorney, Agent, or Firm—Robert E. Burns; Emmanuel J. Lobato; Bruce L. Adams

[57] ABSTRACT

A crimp cutter blade for gripping and cutting out a top end portion of a terminal wire, in which depressions or recesses are formed on a pair of opposing arms between crimping portions for crimping the terminal wires of electronic parts or the like and cutting edges for cutting them, respectively. The depressions absorb upward drift of the terminal wires which is caused by the crimping and cutting of them.

4 Claims, 13 Drawing Figures

CRIMP CUTTER BLADE

BACKGROUND OF THE INVENTION

The present invention relates to the blade of a crimp cutting tool or machine (hereinafter referred to generically as the crimp cutter), and more particularly to a blade suitable for the crimp cutter by which terminal wires of various electronic parts mounted on a printed circuit board are nipped, cut down to suitable lengths and pinched out.

Conventional crimp cutter blades of the type mentioned above have defects, such as application of stresses to electronic parts to be mounted, ununiform-length cutting of terminal wires, and upward drift of the electronic parts from a printed circuit board as mentioned below.

SUMMARY OF THE INVENTION

An object of the present invention is to provide a crimp cutter blade which is able to cut terminal wires of electronic parts mounted on a printed circuit board into a suitable length and to crimp them without drifting the electronic part away from the printed circuit board or applying stresses to the printed circuit board and the electronic parts.

The gist of the present invention is to form depressions or recesses on a pair of opposing arms between crimping portions for crimping terminal wires of electronic parts or the like and cutting edges for cutting them, respectively. The depressions absorb upward drift of the terminal wires which is caused by the crimping and cutting of them.

BRIEF DESCRIPTION OF THE DRAWINGS

The present invention will be described in detail below in comparison with prior art with reference to the accompanying drawings, in which.

DETAILED DESCRIPTION

To make differences between the present invention and prior art clear, examples of conventional art will first be described.

Figure 1:
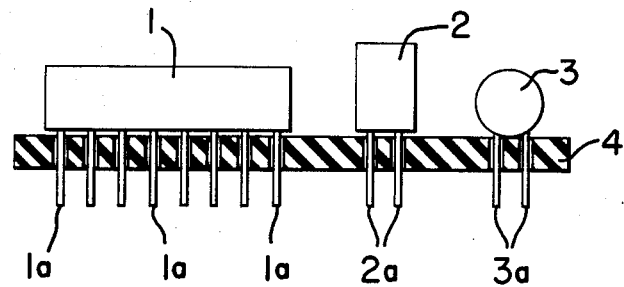
FIG. 1 is a front view including a section illustrating a state in which various electronic parts are mounted on a printed circuit board.

In case of mounting various electronic parts on a printed circuit board, it is a general practice in the art, as shown in FIG. 1, to employ such a process that starts with the insertion of terminals 1a, 2a and 3a of the electronic parts 1, 2 and 3 into holes made in a printed circuit board 4, which is followed by cutting terminal portions projecting out of the underside of the printed circuit board 4 down to a suitable length and then by soldering the terminal wires to the printed circuit board 4 through automatic soldering or the like. Of the electronic parts, however, a part with a small number of terminal wires, such as a capacitor, presents a problem as it is unstable and is readily shaked by vibration unless it is fastened to the printed circuit board. To cope with this problem, manual tack soldering is usually employed; but this increases the number of steps involved in the mounting of electronic parts on the printed circuit board 4 and constitutes an obstacle to the full automation of mounting.

Figure 2:
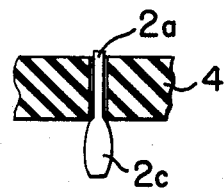
FIG. 2 is a fragmental view including a section illustrating a terminal of one of the electronic parts cut by a conventional crimp cutting tool.
Figure 3:
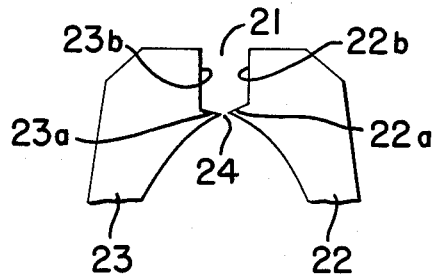
FIG. 3 is a fragmental front view illustrating the blade structure of the conventional crimp cutting tool.
Figure 4:
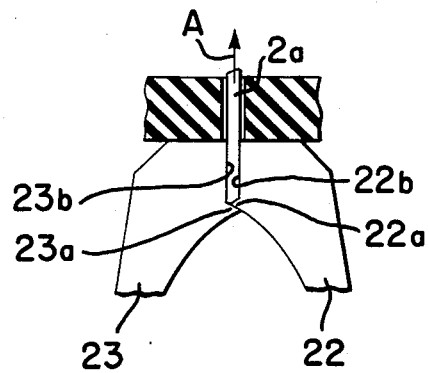
FIG. 4 is a fragmental front view including a section illustrating a state in which the terminal of the electronic part is cut and crushed by the conventional crimp cutting tool.

A method which dispenses with the abovementioned manual tack soldering is to cut, for example, the terminal wire 2a of the electronic part 2, into a suitable length and pinch out the terminal portion 2c protruding from the printed circuit board 4, thereby mounting the electronic part 2 on the printed circuit board 4, as shown in FIG. 2. As a tool for cutting the terminal wire of the electronic part and crimping the protruding portion, as mentioned above, there has been used a crimp cutter which has a blade 21 of such a structure as shown in FIG. 3. In FIG. 3, the blade 21 is made up of two opposing arms 22 and 23, and the opposing faces of the arms 22 and 23 respectively have cutting edges 22a and 23a for cutting the terminal wire of an electronic part and pressing portions 22b and 23b for crimping the terminal wire. By pressing the arms 22 and 23 towards each other after inserting the terminal wire of the electronic part into a gap 24 defined between the pressing portions 22b and 23b and the cutting edges 22a and 23a, the terminal wire is cut with the cutting edges 22a and 23a and, at the same time, crimped with the pressing portions 22b and 23b.

When cutting and crimping, for example, a terminal wire of an electronic part, through using the blade 21 of such a structure as shown in FIG. 3, however, the terminal wire 2a is squeezed out, by the closing operation of the cutting edges 22a and 23a, towards the printed circuit board 4, as indicated by the arrow A, resulting in the electronic part 2 being drifted away from the surface of the printed circuit board 4. Further, when the number of terminal wires is large as in the case of the electronic part 1 in FIG. 1, stresses are applied, by cutting and pressing the terminal wires, to the printed circuit board 4 and the electronic part 1, and in addition, the terminal wires are not cut into the same length.

Embodiments of the present invention will now be described.

Figure 5A:
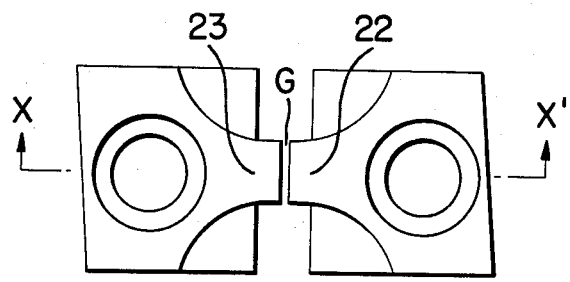
FIGS. 5A and 5B are series of diagrams illustrating the entire blade structure for the crimp cutting tool according to the present invention, FIG. 5A being a plan view and FIG. 5B a section along a plane X—X' in FIG. 5A.
Figure 5B:
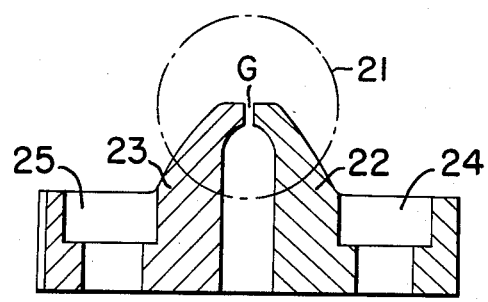
Figure 6:
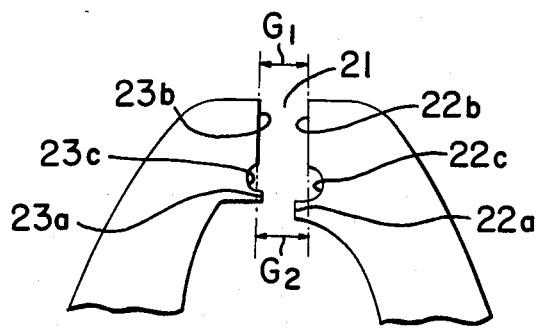
FIG. 6 is an enlarged front view of the top portion of the blade according to the present invention.

FIG. 5 illustrates the entire structure of a crimp cutter blade according to an embodiment of the present invention, FIG. 5A being a plan view and FIG. 5B a sectional view taken on the line X—X' in FIG. 5A. As illustrated, a pair of arms 22 and 23 are provided, with their top end portions held in opposing relation. A gap G defined by the top end portions of the arms 22 and 23 is adjustable when the arms 22 and 23 are fixed to manual or automatic mounting tools by means of bolts which are inserted into holes 24 and 25 made in the arms. FIG. 6 is an enlarged diagram of the blade structure. As shown, the arms 22 and 23 respectively have crimping portions 22b and 23b and flattened cutting edges 22a and 23a, in addition, depressions 22c and 23c formed between the crimping portion 22b and the cutting edge 22a and between the crimping portion 23b and the cutting edge 23a, respectively, for absorbing upward drift of a terminal wire. In this embodiment, the cutting edges 22a and 23a are formed so that the underside of the cutting edge 23a makes contact with the top surface of the cutting edge 22a as in the case of scissors. Moreover, the upper gap G1 and the lower gap G2 of a gap G defined by the crimping portions 22b and 23b bear a relation $G1<G2$; namely, the gap G has an inverted V-letter shape.

Figure 7:
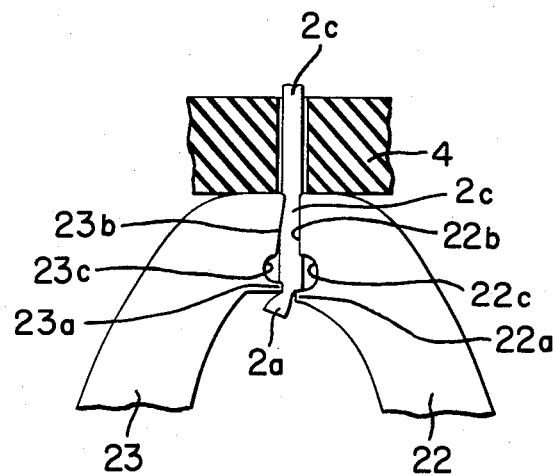
FIG. 7 is a fragmental front view including a section illustrating the state of crushing and cutting the terminal wires of an electronic part by the crimp cutter blade of the present invention.

FIG. 7 is a diagram showing the cutting of the terminal wire 2a of the electronic part 2 by the blade depicted in FIG. 6. As illustrated, when closing the arms 22 and 23 while holding the terminal wire 2a between the crimping portions 22b and 23b, between the depressions 22c and 23c and between the cutting edges 22a and 23a, the terminal wire 2a is crimped by the crimping portions 22b and 23b and is cut by the cutting edges 22a and 23a. In this process, since the cutting edges 22a and 23a are closely engaged with each other, the terminal wire is drifted up, but its upward drift is absorbed by the depressions 22c and 23c. In the embodiment of FIG. 6, the gap G defined by the crimping portions shaped in an inverted V-letter form so as to improve the effect of absorbing the upward drift of the terminal wire, but the gap may also be of the same width although its effect is a little degraded.

Figure 8:
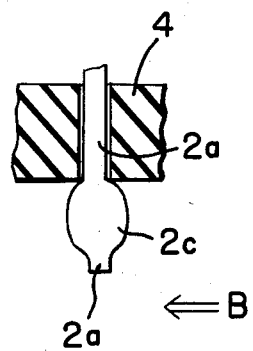
FIGS. 8 and 9 are fragmental front views each including a section illustrating the shape of the crushed and cut terminal wire of the electronic part.
Figure 9:
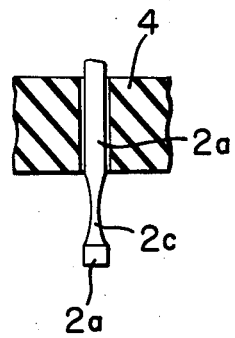

FIG. 8 shows the terminal 2a cut by the cutting edges 22a and 23a and crushed by the pressing portions 22b and 23b. As shown in FIG. 8, since the top end portion of the terminal wire 2a is crushed by the pressing portions 22b and 23b to form a substantially bi-symmetrically expanded portion 2c. The lower end portion of the terminal wire 2a contiguous to the expanded portion 2c is held in the gap defined by the depressions 22c and 23c, and hence is not crushed but remains unchanged. Furthermore, since shoulders of the expanded portion 2c are held in close contact with the underside of the printed circuit board 4, the electronic part 2 is mounted onto the printed circuit board 4 and will not shake. FIG. 9 is a section viewed from the direction indicated by the arrow B in FIG. 8.

Figure 10:
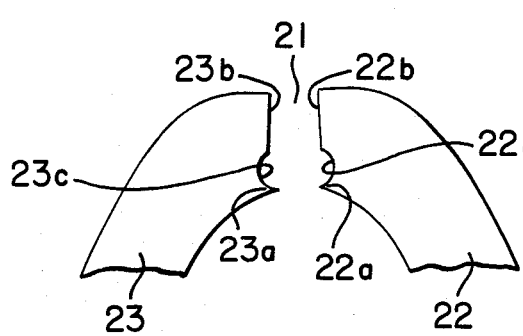
FIGS. 10 and 11 are fragmental front views illustrating crimp cutter blade structures of other embodiments of the present invention.

FIG. 10 is a diagram illustrating the structure of the crimp cutter blade according to another embodiment of the present invention, in which the tips of the cutting edges of the arms 22 and 23 abut against each other. This structure is superior to that of FIG. 6 in terms of cutting quality, finish and dispersion of cutting powder but inferior thereto in terms of the life of the cutting edges 22a and 23a.

Figure 11:
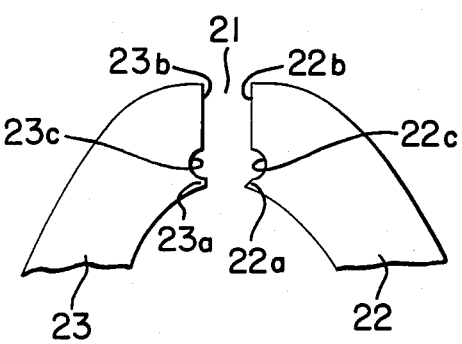

FIG. 11 illustrates the blade structure for the crimp cutter according to still another embodiment of the present invention, in which the cutting edges 22a and 23a of the arms 22 and 23 are arranged so that their tips cross each other. With such a structure, as in the case of the embodiment of FIG. 10, the blade is superior to that of FIG. 6 in terms of cutting quality, finish and dispersion of cutting powder but somewhat inferior thereto in terms of liftime. Further, this structure is superior to that of FIG. 10 in terms of lifetime but slightly inferior thereto in cutting ability and dispersion of cutting powder.

Figure 12:
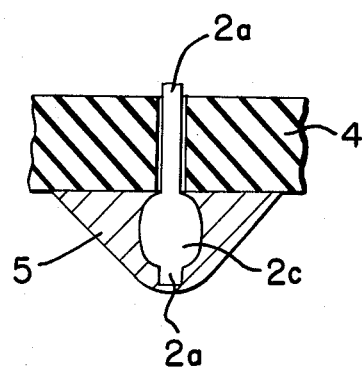
FIG. 12 is a fragmental front view including a section illustrating a soldered portion of the electronic part handled by a blade of the present invention.

As has been described in the foregoing, according to the embodiments of the present invention, when crushing, by the pressing portions 22b and 23b, and cutting, by the cutting edges 22a and 23a, a terminal wire of an electronic part protruding from the underside of the printed circuit board 4, upward drift of the terminal is absorbed by the depressions 22c and 23c. Accordingly, various electronic parts can be mounted on the printed circuit board 4 without applying stresses to the printed circuit board 4 and the electronic parts and without drifting the electronic parts away from the printed circuit board 4. Moreover, since terminal wires are each cut after being gripped and crushed, they can be cut into the same length and the cut ends can be made symmetrical with respect to its center line. As a result, the terminal wire 2a of the electronic parts can be covered with solder symmetrically with respect to the expanded portion 2c and its tip 2a, as indicated by reference numeral 5 in FIG. 12. This ensures stable soldering of the printed circuit board 4 and eliminates poor soldering.

While the foregoing embodiments have been described in connection with th case where electronic parts are mounted on a printed circuit board and their terminal wires projecting out of the underside of the printed circuit board are cut off, it is a matter of course that the crimp cutter blade according to the present invention is not limited specifically thereto but is effective in the cases where it is undesirable that a wire to be cut, when crimped by the pressing portions 22b and 23b, drifts upwardly of the blade to apply stress to another member above the blade, and where it is desired to cut wires into the same length without applying thereto any bending moment.

As has been described in the foregoing, according to the balde for the crimp cutting tool of the present invention, since depressions or air gaps are provided between the pressing portions and the cutting edges for absorbing upward drift of a wire to be cut, it is possible to prevent the wire from sliding upwardly of the balde when it is being crushed and cut, thus eliminating the possibility of applying stresses a member present above the blade. Moreover, since the wires are each cut after being gripped and crushed by the pressing portions, they can be cut into the same length.

What we claim is:

1. A crimp cutter blade for crimping and cutting terminal wires of electronic components mounted on printed circuit boards and the like comprising, a pair of separate arms mounted on a crimping tool for movement toward and away from each other, each arm having a free end, a crimping portion terminating at a corresponding free end and having a flat clamping face, each face having a respective recess terminated by a traverse cutting edge thereon remote from the clamping face, the cutting edge terminating the crimping portion of the corresponding arm, the arms being movable to a position in which the clamping faces are spaced for receiving a free end portion of a terminal wire on an electronic component extending through the printed circuit board and the like longitudinally between the clamping faces, longitudinally across the recesses and longitudinally across the trasverse cutting edges for crimping and severing thereof while the electronic component is mounted on the printed circuit or the like, the arms being movable toward each other to opposed positions in which the corresponding clamping faces, recesses and cutting edges are disposed opposed and the terminal wire is cut by the cutting edges while the terminal wire is clamped, crushed and crimped by the said clamping faces, the recesses being disposed to receive material of the terminal wire flowed by the clamping faces thereinto when said arms are displaced toward each other to effectively clamp, crimp and cut the free end portion of the terminal wire, the recesses being dimensioned such tht flow of material of the terminal wire thereinto during the crimping and severing of the free end portion is of a volume flowed in a direction toward the terminal wire free end portion for effectively cancelling any tendency of longitudinal displacement of the remaining terminal wire in a direction away from the free end portion when severed, and said opposed clamping faces being oriented to crush the terminal wire forming an enlargement laterally thereon immediately adjacent the printed circuit board or the like thereby to retain the component in place.

2. A crimp cutter blade according to claim 1, in which each end face is a flat end face on the corresponding arm.

3. A crimp cutter blade according to claim 2, in which each free end has a flat face and each clamping face is on a bias so that it converges toward the other clamping face when opposed thereto, and the convergence being in a direction away from the free end portion of the terminal wire being severed when a terminal wire is clamped by the arms, for severing, whereby the convergence assists in flowing material of the terminal wire in a direction and volume precluding said advancing of the terminal wire away from the free end portion thereof when severed.

4. A crimp cutter blade according to claim 2, in which at least one cutting edge on one said flat end face has a flattened tip edge.

* * * * *